(12) United States Patent
He et al.

(10) Patent No.: US 12,079,049 B2
(45) Date of Patent: Sep. 3, 2024

(54) SYSTEM AND METHOD FOR A THERMALLY CONDUCTIVE AND RADIO FREQUENCY TRANSPARENT ANTENNA WINDOW FOR AN ACTIVE 5G ANTENNA

(71) Applicant: Dell Products, LP, Round Rock, TX (US)

(72) Inventors: Qinghong He, Austin, TX (US); Travis C. North, Cedar Park, TX (US); Suresh K. Ramasamy, Cedar Park, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 240 days.

(21) Appl. No.: 17/579,224

(22) Filed: Jan. 19, 2022

(65) Prior Publication Data
US 2023/0229211 A1   Jul. 20, 2023

(51) Int. Cl.
*H01Q 1/02* (2006.01)
*G06F 1/16* (2006.01)
*G06F 1/20* (2006.01)
*H01Q 1/22* (2006.01)
*H05K 7/20* (2006.01)

(52) U.S. Cl.
CPC ............ *G06F 1/203* (2013.01); *G06F 1/1698* (2013.01); *H01Q 1/02* (2013.01); *H01Q 1/2266* (2013.01); *H05K 7/2039* (2013.01)

(58) Field of Classification Search
CPC ........ H01Q 1/02; H01Q 1/2266; G06F 1/203; H05K 7/2039
See application file for complete search history.

(56) References Cited

U.S. PATENT DOCUMENTS

| | | |
|---|---|---|
| 6,415,612 B1 | 7/2002 | Pokharna |
| 8,659,901 B2 | 2/2014 | Macmanus |
| 9,397,387 B1 | 7/2016 | Guterman |
| 9,799,942 B2 | 10/2017 | Pu |
| 10,162,390 B2 | 12/2018 | Sweet |
| 10,389,007 B1 | 8/2019 | Choi |
| 10,826,162 B1 * | 11/2020 | Jeon .................... H04M 1/0277 |
| 11,050,144 B1 | 6/2021 | Hersh |
| 11,527,814 B2 * | 12/2022 | Han ...................... H01Q 1/243 |
| 2002/0171600 A1 | 11/2002 | Lindenmeier |
| 2006/0061511 A1 | 3/2006 | Enoki |
| 2011/0261551 A1 | 10/2011 | Chirila |

(Continued)

*Primary Examiner* — Zachary Pape
*Assistant Examiner* — Steven Ngo
(74) *Attorney, Agent, or Firm* — Prol Intellectual Property Law, PLLC; H. Kenneth Prol

(57) ABSTRACT

An information handling system with an antenna cooling system, comprising a processor; a memory; a power management unit (PMU) operatively coupled to the processor; a wireless interface adapter with a radio module within a chassis of the information handling system; and an active antenna system with an antenna mounted at an aperture in a wall of the chassis of the information handling system; a thermally conductive and radio frequency (RF) transparent window formed seamlessly within the aperture in the wall of the chassis of the information handling system and where the thermally conductive and RF transparent window is configured to permit antenna RF transmission while dissipating heat generated by the active antenna system.

20 Claims, 6 Drawing Sheets

(56) References Cited

U.S. PATENT DOCUMENTS

| | | |
|---|---|---|
| 2013/0222201 A1 | 8/2013 | Ma |
| 2013/0223836 A1 | 8/2013 | Gibbs |
| 2013/0299125 A1 | 11/2013 | Shi |
| 2015/0077957 A1 | 3/2015 | Sakatani |
| 2016/0119796 A1 | 4/2016 | Ho |
| 2016/0204502 A1* | 7/2016 | Misra ................. H01Q 1/42 |
| | | 343/702 |
| 2018/0013198 A1 | 1/2018 | Rubin |
| 2019/0305402 A1 | 10/2019 | Dalmia |
| 2019/0373773 A1* | 12/2019 | Bougher ............ B29C 64/106 |
| 2020/0043991 A1* | 2/2020 | Noh .................. G06F 1/1688 |
| 2020/0153115 A1* | 5/2020 | Yun .................. G06F 3/0412 |
| 2020/0185806 A1 | 6/2020 | Bhalla |
| 2020/0192439 A1* | 6/2020 | Lin ................... H05K 1/141 |
| 2021/0159599 A1* | 5/2021 | Park .................. H01Q 1/243 |
| 2021/0249751 A1* | 8/2021 | Lee ................... H01Q 1/02 |
| 2021/0392800 A1 | 12/2021 | Ramasamy |
| 2021/0408659 A1* | 12/2021 | Lee ................... H05K 5/06 |

\* cited by examiner

SYSTEM AND METHOD FOR A THERMALLY CONDUCTIVE AND RADIO FREQUENCY TRANSPARENT ANTENNA WINDOW FOR AN ACTIVE 5G ANTENNA

FIELD OF THE DISCLOSURE

The present disclosure generally relates to thermally regulating heat produced by operation of an active antenna module of an information handling system. The present disclosure more specifically relates to a system and method to cool an active antenna of the information handling system using a thermally conductive window.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include an active antenna system used to communicate with a wireless network and remote and edge compute servers.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
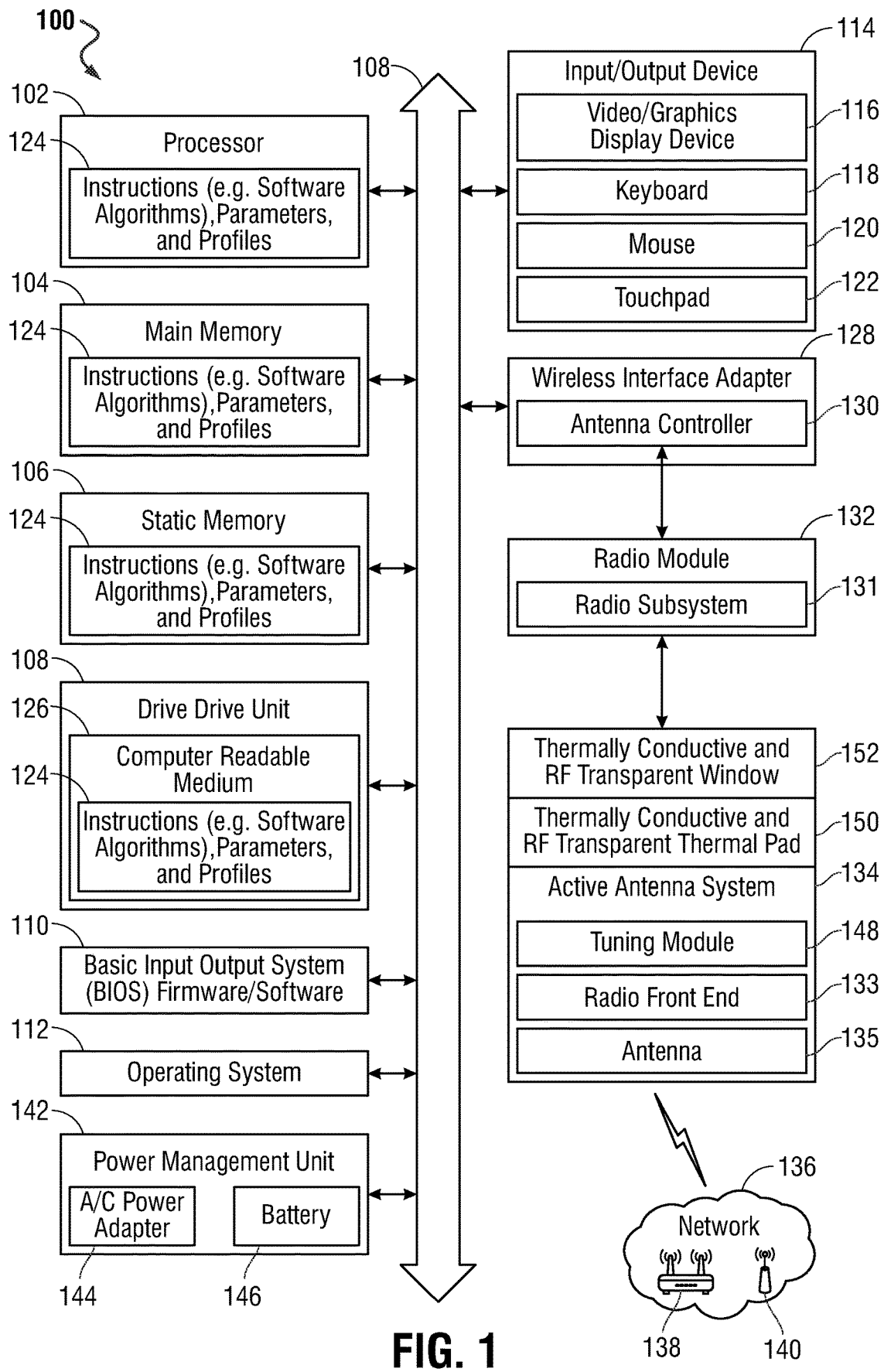
FIG. 1 is a block diagram illustrating an information handling system with an active antenna system housed within a housing of the information handling system according to an embodiment of the present disclosure.

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Information handling systems may include one or more antennas of a wireless interface adapter used to operatively couple the information handling system to a wireless network. These information handling systems may be made mobile so that a user may travel with an information handling system from location to location and still access a wireless network. The antennas may be used to operatively couple the information handling system to a wireless network via, for example, 5G standards protocol. Other standards may be used and the present specification contemplates those uses. With the use of edge computing, such as for containers of software applications, to provide compute offload, the amount of data transmitted to and from the information handling system may be relatively higher. As such 5G, sub-6 GHz, and mmWave frequencies as well as WiFi 6 or WiFi 6E frequencies may be used to facilitate this increased level of data throughput. In some instances, an active antenna system of a wireless interface adapter may be used to transmit data using these frequencies. An active antenna system may be an antenna module separate from a radio module, for example, that includes an active antenna or plural antennas and a number of other circuitries used to support antenna operation is some embodiments. In other embodiments, an active antenna system may be included as part of a radio system in a wireless adapter with signal and data processing. Other circuitry of an antenna system or radio may include amplifiers, signal processors, tuning modules, and other devices that create heat during transmission at the active antenna system. This heat created may cause damage to the active antenna system and other components of the information handling system if a cooling system is not implemented to cool the active antenna system down, including antennas. In some instances, a dedicated heat sink may be operatively coupled to a backside of a heat pad operatively coupled to a backside of the active antenna system. Such a dedicated heat sink may be situated opposite from the direction of the transmission or reception of signal by the active antenna, or in other words, internal and within the information handling system chassis from an edge-disposed active antenna system and its antennas. This heat sink increases the physical footprint within the chassis of the information handling system while also directing heat inward into that chassis.

The present specification describes an information handling system with an antenna cooling system that includes a processor, a memory, a power management unit (PMU) operatively coupled to the processor, and a window adapter having an active antenna system and radio within a chassis of the information handling system operatively coupled to the processor, memory, and PMU. In an embodiment, the active antenna system may be operatively coupled to the processor via a radio module of a wireless interface adapter used to provide data signals to the active antenna system for transception of data from the active antenna to a wireless network.

In an embodiment, the heat produced by the active antenna is managed by the inclusion of a thermally conductive and radio frequency (RF) transparent window formed in a wall of the chassis of the information handling system. In a further embodiment, a thermally conductive and RF transparent thermal pad placed between the active antenna system and the thermally conductive and RF transparent window to assist in thermal conduction between the active antenna system and the thermally conductive and RF transparent window. The thermally conductive and RF transparent window may made of a liquid-crystal, metal-dioxide, polymer-based plastic that receives the heat from the active antenna, and via the thermally conductive and RF transparent thermal pad in some embodiments, and distributes that heat from the active antenna system and the internal spaces of the information handling system. In embodiments where the chassis of the information handling system is made of metal, the heat at the thermally conductive and RF transparent window may be directed into and dissipated into the metal chassis. In some embodiments, the chassis may be a display housing that includes an "a-cover" which serves as a back cover for the display housing and a "b-cover" which may serve as the bezel, if any, for a display screen of the information handling system such as a laptop information handling system. In a further example embodiment, the laptop information handling system case may have a chassis that forms a base housing and includes a "c-cover" housing a keyboard, touchpad, speaker grill, and any cover in which these components are set and a "d-cover" housing a processing device, memory, power management unit (PMU), wireless adapter and other information handling system components in the base housing for the laptop information handling system. In an embodiment, the active antenna system may be placed within the base chassis formed by the d-cover and c-cover. In an embodiment, the thermally conductive and RF transparent window may be placed within a hole or aperture formed in a sidewall or other wall of the c-cover and/or d-cover. In an embodiment, the active antenna system may be placed within the display chassis formed by the a-cover and b-cover (if any). In an embodiment, the thermally conductive and RF transparent window may be placed within a aperture formed in a sidewall or other wall of the a-cover and/or b-cover in example embodiments where the information handling system is a tablet-type information handling system for example.

In an embodiment, the antenna cooling system may use an aerogel layer to prevent heat from passing to a portion of the chassis of the information handing system. In an embodiment, an aerogel layer may be used to prevent heat from passing into a c-cover of the chassis while passing heat into a d-cover of the chassis. In this embodiment, the aerogel layer may limit heat passing into a portion of the chassis where a user may rest his or her hands, but instead is passes the heat into a lower portion of the chassis, e.g., the d-cover, away from the user's hands.

Turning now to the figures, FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system 100 may include memory 104, 106, or 108 (volatile (e.g., random-access memory, etc.), nonvolatile (read-only memory, flash memory etc.) or any combination thereof), one or more processing resources 102, such as a central processing unit (CPU), a graphics processing unit (GPU), hardware or software control logic, or any combination thereof. Additional components of the information handling system 100 may include one or more memory storage devices 106 or 108, one or more communications ports for communicating with external devices, as well as various input and output (I/O) devices 114, such as a keyboard 118, the touchpad 122, a mouse 120, a headset, a stylus, a video/graphics display device 116, or any combination thereof. Portions of an information handling system 100 may themselves be considered information handling systems 100.

Information handling system 100 may include devices or modules that embody one or more of the devices or execute instructions for the one or more systems and modules described herein, and operates to perform one or more of the methods. The information handling system 100 may execute instructions (e.g., software algorithms), parameters, and profiles 124 that may operate on servers or systems, remote data centers, or on-box in individual client information handling systems according to various embodiments herein. In some embodiments, it is understood any or all portions of instructions (e.g., software algorithms), parameters, and profiles 124 may operate on a plurality of information handling systems 100.

The information handling system 100 may include a processor 102 such as a CPU or GPU, control logic or some combination of the same. Any of the processing resources may operate to execute code that is either firmware or software code. Moreover, the information handling system 100 may include memory such as main memory 104, static memory 106, or other memory of computer readable medium 126 storing instructions (e.g., software algorithms), parameters, and profiles 124 executable by the antenna controller 130, embedded controller, or any other processing device (e.g., processor 102), and disk drive unit 108 (volatile (e.g., random-access memory, etc.), nonvolatile memory (read-only memory, flash memory etc.) or any combination thereof. The information handling system 100 may also include one or more buses 148 operable to transmit communications between the various hardware components such as any combination of various I/O devices 114 as well as between processors 102, the embedded controller, the operating system (OS) 112, the basic input/output system (BIOS) 110, the wireless interface adapter 128 the radio module 132, and the power management unit (PMU) 142, among other components described herein.

The information handling system 100 may further include a video/graphics display device 116. The video/graphics display device 116 in an embodiment may function as a liquid crystal display (LCD), an organic light emitting diode (OLED), a flat panel display, or a solid-state display. Additionally, the information handling system 100 may include an I/O device 114 that allows the user to interface with the information handling system 100 via the video/graphics display device 116, such as a cursor control device (e.g., the mouse 120, touchpad 122, or gesture or touch screen input), and the keyboard 118 or stylus, among others. Various drivers and control electronics may be operatively coupled to operate the I/O device 114 according to the embodiments described herein.

The network interface device in FIG. 1 is shown as wireless interface adapter 128 but may also be a wired network interface device as is understood in the art and may provide connectivity to a network 136, e.g., a wide area network (WAN), a local area network (LAN), wireless local area network (WLAN), a wireless personal area network (WPAN), a wireless wide area network (WWAN), or other network. The network interface device shown as wireless interface adapter 128 may provide connectivity to a network 136 via operation of a radio module 132 with control by an antenna controller 130. In an embodiment, the radio module 132 may be operatively coupled to the antenna controller 130 and may be part of wireless interface device 128 but may form a different physical device in some embodiments. It is appreciated that any number of radio subsystems 131 and RF front ends 133 may be associated with the radio module 132 and may also be associated with a plurality of antennas such as an active antenna system 134 and any number of antennas 135 within the information handling system 100 and may operate under any wireless protocol described herein. In the shown embodiment, the radio module 132 with the radio subsystem 131 is operatively coupled to the active antenna system 134 with antenna 135 with the radio subsystem 131 and front end 133. In an example embodiment, the radio module 132 may be a 5G mmWave radio module 132. In an example embodiment, the radio module 132 may be a long-term evolution (LTE) protocol radio module 132 or any other type of radio module. In an embodiment described herein, the active antenna system 134 may further include, for example, an antenna Bluetooth (BT) and an amplifier, tuning module 148, or other heat-producing circuitry that, during operation, creates an amount of heat. This heat is created when the antenna 135 of the active antenna system 134 is transmitting, processing that data, or converting that digital data received from the processor 102 into radio frequency (RF) signals used to transmit that data wirelessly via the antenna 135 associated with the radio module 132. It is this heat created during operation of the active antenna system 134 with antenna 135 that the thermally conductive and RF transparent thermal pad 150 and thermally conductive and RF transparent window 152 (among other devices) described herein are used to dissipate an amount of heat away from the active antenna system 134 without interfering with the antenna 135 as described herein.

Connectivity to a network 136 may be via wired or wireless connection. As shown, the wireless interface adapter 128 may operate in accordance with any wireless data communication standards. To communicate with a wireless local area network, standards including IEEE 802.11 a/h/j/n/ac/ax WLAN standards, IEEE 802.15 WPAN standards, WWAN such as 3GPP or 3GPP2, or similar wireless standards may be used. In some aspects of the present disclosure, one wireless interface adapter 128 may operate two or more wireless links. Information handling systems 100 including those that are mobile in embodiments of the present disclosure may employ a plurality of antenna systems for communication via wireless links operating on a variety of radio access technologies (RAT). For example, a mobile information handling system 100 in an embodiment of the present disclosure may employ separate antenna systems for Wi-Fi signals, wireless wide area network (WWAN) signals, Bluetooth signals, and wireless local area network (WLAN) signals. WWAN signals in embodiments of the present disclosure may include 2G standards such as GSM, 2.5G standards such as GSM EDGE and GPRS, 3G standards such as W-CDMA/UMTS and CDMA 2000, 4G standards such as LTE, LTE-A, LTE-LAA, emerging 5G standards, or WiMAX, small cell WWAN, and the like. Wi-Fi and WLAN signals in embodiments of the present disclosure may include wireless links adhering to standards such as, for example, IEEE 802.11 WiFi, IEEE 802.11ad WiGig, IEEE 802.15 WPAN, and IEEE 802.11ax-2021 (e.g., WiFi 6 and 6E, 6 GHz technologies). In other aspects, several antenna systems may be available for each RAT to enable aggregated data communications such as via plural multiple in, multiple out (MIMO) streams (e.g., Wi-Fi MIMO or cellular MIMO) to enhance data bandwidth or reliability. In some examples, an information handling system 100 may support multi-RAT radios (4G, 5G, WLAN) that require simultaneous transmission using multiple antenna 135, or even multiple active antenna systems 134 described herein, to support various modes of transmission (e.g., uplink (UL) MIMO and 5G E-UTRAN new radio (EN-DC)). With 5G technology, these information handling systems may use, in an example embodiment, sub-6 GHz antennas and mmWave antennas as well as WLAN antennas, resulting in several antennas in the information handling system. The wireless interface adapter 128 may cause the radio module 132 to wirelessly communicate with an access point 138 or base station 140 within a network 136.

Wireless interface adapter 120 may connect to any combination of macro-cellular wireless connections including 2G, 2.5G, 3G, 4G, 5G or the like from one or more service providers or privately administered network providers. The wireless interface adapter 128 may also connect to any WLAN networks such as Wi-Fi networks. Utilization of radiofrequency communication bands according to several example embodiments of the present disclosure may include bands used with the WLAN standards and WWAN carriers, which may operate in both licensed and unlicensed spectrums.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 136 may communicate voice, video or data over the network 136. Further, the instructions 124 may be transmitted or received over the network 136 via the network interface device or wireless interface adapter 128.

The information handling system 100 may include a set of instructions 124 that may be executed to cause the computer system to perform any one or more of the methods or computer-based functions disclosed herein. For example, instructions 124 may be executed by an antenna controller 130 and radio module 132, and may include software agents, or other aspects or components used to execute the methods and systems described herein. Various software modules comprising application instructions 124 may be coordinated by an operating system (OS) 112, and/or via an application programming interface (API). An example OS 112 may include Windows®, Android®, and other OS types. Example APIs may include Win 32, Core Java API, or Android APIs. Additionally, execution of the instructions described herein may be via execution of firmware by the antenna controller 130.

The disk drive unit 108 may include a computer-readable medium 126 in which one or more sets of instructions 124 such as software may be embedded and executed by the antenna controller 130, processor 102, and/or embedded controller, in an embodiment. Similarly, main memory 104 and static memory 106 may also contain a computer-readable medium for storage of one or more sets of instructions, parameters, or profiles 124. The disk drive unit 108 and static memory 106 may also contain space for data storage. Further, the instructions 124 may embody one or more of the methods or logic as described herein. For example, instructions relating to and executed by the antenna controller 130, embedded controller, processor 102, software algorithms, processes, and/or methods may be stored here. In a particular embodiment, the instructions, parameters, and profiles 124 may reside completely, or at least partially, within the main memory 104, the static memory 106, and/or within the disk drive 108 during execution by the processor 102 of information handling system 100. As explained, some or all of the instructions 124 to be executed by a processor 102 for software applications may be executed locally, remotely or a combination thereof. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The computer executable instructions 124 to be executed by the antenna controller 130, processor 102, or embedded controller may be stored in static memory 106, or the disk drive unit 108 on a computer-readable medium 126 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

As described herein, the information handling system 100 may further include a power management unit (PMU) 142 (a.k.a. a power supply unit (PSU)). The PMU 142 may manage the power provided to the components of the information handling system 100 such as the processor 102, components of a cooling system such as a fan, one or more disk drive units 108, a graphical processing unit (GPU), a video/graphic display device 116 or other I/O device 114 such as a stylus, and other components that may require power when a power button has been actuated by a user. In an embodiment, the PMU 142 may monitor power levels and be electrically coupled to the information handling system 100 to provide this power and coupled to bus 148 to provide or receive data or instructions. The PMU 142 may regulate power from a power source such as a battery 146 or A/C power adapter 144. In an embodiment, the battery 146 may be charged via the A/C power adapter 144 and provide power to the components of the information handling system 100 via wired connections as applicable, or when A/C power from the A/C power adapter 144 is removed.

As described herein, the information handling system 100 includes the active antenna system 134. This active antenna system 134 may include additional circuitry apart from an antenna 135 and may include an array of antennas 135 or a plurality of antennas 135. As described herein, the active antenna system 134 may include an antenna or antennas 135 or other heat-producing circuitry such as a tuning module 148. This heat, if not dissipated, may heat the information handling system chassis to at or above permitted chassis skin temperatures uncomfortable to users to touch or may damage the active antenna system 134 or other components of the information handling system 100. In an embodiment described herein, the active antenna system 134 is operatively coupled to a thermally conductive and RF transparent thermal window 152. This thermally conductive and RF transparent window 152 may be used with a thermally conductive and RF transparent thermal pad 150 that may be made of any thermally conductive material that directs heat away from the active antenna system 134 and dissipates that heat into the thermally conductive and RF transparent window 152 in some embodiments. In other embodiments, the active antenna system 134 may be directly operatively coupled to the thermally conductive and RF transparent window 152 without the use of the thermally conductive and RF transparent thermal pad 150. In another embodiment, a thermally heat conductive adhesive may be used to secure the active antenna system 134 to the thermally conductive and RF transparent window 152 while also transmitting heat away from the active antenna system 134 and dissipated into the thermally conductive and RF transparent window 152. In an embodiment, the thermally conductive and RF transparent thermal pad 150 or heat conductive adhesive may be made of a thermally conductive material such as silicone, paraffin wax, and acrylic among others. The adhesives may be any type of adhesive that allows for transmission of heat from the active antenna system 134 to the thermally conductive and RF transparent window 152. These thermally conductive and transmissive adhesives may include an epoxy resin, a glue including a metal oxide, silica, or ceramic microspheres, among others.

As described, the thermally conductive and RF transparent thermal pad 150 or thermally heat conductive adhesive may transmit heat into the thermally conductive and RF transparent window 152. The thermally conductive and RF transparent window 152 may be made of any thermally conductive material that, in an embodiment, transmits heat into a chassis of the information handling system 100. In an embodiment, the thermally conductive and RF transparent window 152 may be made of a liquid-crystal, metal-dioxide, polymer-based plastic. This plastic may be opaque, colored, or clear. The thermally conductive and RF transparent window 152 may include any metal-oxide that is infused into the plastic and acts as a heat sink to receive heat from the thermally conductive and RF transparent thermal pad 150 or thermally heat conductive adhesive. Because the metal-oxide is infused into the liquid-crystal polymer-based plastic and because the metal oxide is RF transparent, the metal-oxide does not inhibit the transmission and reception of data from and to the active antenna system 134. The chemical properties of the thermally conductive and RF transparent window 152, however, do transfer heat from the active antenna system 134 to the chassis of the information handling system 100. In an embodiment, the thermally conductive and RF transparent window 152 may be made of COOLPOLY® D5506 manufactured by Celanese®.

In one embodiment, the thermally conductive and RF transparent window 152 may be placed within a aperture formed in a sidewall of a c-cover of the base chassis of the information handling system 100 such as a laptop information handling system. In another embodiment, the thermally conductive and RF transparent window 152 may be placed within a aperture formed in a d-cover of the base chassis of the information handling system 100. In these embodiments, either of the c-cover or d-cover may be made of metal so that heat at the thermally conductive and RF transparent window 152 may be transmitted into the chassis of the information handling system 100 and dissipated. In one embodiment, because the c-cover may be touched by the user, the c-cover may be made of a plastic or a glass while the d-cover is made of metal. In, another embodiment, in order to prevent heat from dissipating into the c-cover (e.g., a metal c-cover) the antenna cooling system comprising the thermally conductive and RF transparent thermal pad 150 and thermally conductive and RF transparent window 152 may further include a layer of aerogel to prevent heat from the thermally conductive and RF transparent window 152 from dissipating into the c-cover. In some embodiments, a layer of aerogel may also be placed behind the active antenna system 134 to prevent heat from dissipating into an interior of the chassis of the information handling system 100.

The size of the antenna cooling system may be significantly smaller than if the active antenna system 134 was cooled using a heat sink placed behind the active antenna system 134 an and internal in the information handling system chassis relative to the active antenna system 134 location at the edge of the chassis. Further, the active antenna system 134 and thermally conductive and RF transparent window 152 described herein prevents heat from dissipating into the chassis of the information handling system 100 while the use of a heat sink placed behind the active antenna system 134 would direct heat into the chassis with the need of another cooling device to dissipate that heat away from the interior of the chassis.

In an embodiment, the information handling system 100 may include one or more of an OS 112, and basic BIOS firmware/software 110 or application programs that may be executable instructions 124 executed at any processor 102 and stored at one or more memory devices 104, 106, or 180. BIOS firmware/software 110 functions to initialize the information handling system 100 on power up, to launch an OS 112, and to manage input and output interactions between the OS 112 and the other elements of information handling system 100 including the radio module 132 and antenna controller 130. In a particular embodiment, BIOS firmware/software 110 resides in memory 104, and include machine-executable code that is executed by processor 102 to perform various functions of information handling system 100 as described herein. In another embodiment (not illustrated), application programs and BIOS firmware/software 110 reside in another storage medium of the information handling system 100. For example, application programs and BIOS firmware/software 110 can reside in drive unit 108, in a ROM (not illustrated) associated with the information handling system 100, in an option-ROM (not illustrated) associated with various devices of the information handling system 100, in a storage system (not illustrated) associated with network channel of a wireless interface adapter 128, in another storage medium of the information handling system 100, or a combination thereof. Executable code instructions 124 for application programs and BIOS firmware/software 110 can each be implemented as single programs, or as separate programs carrying out the various features as described herein.

Figure 2:
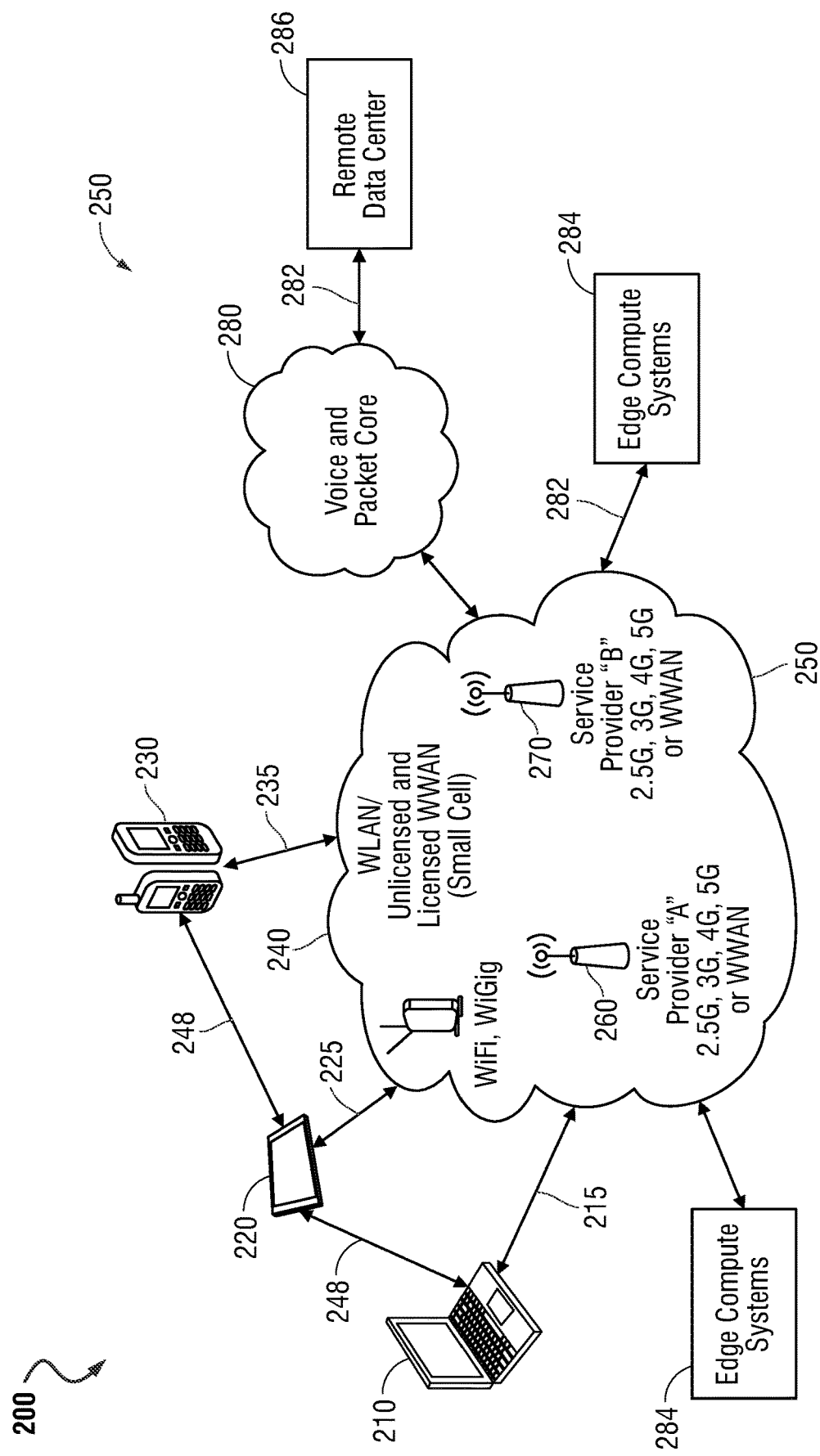
FIG. 2 is a block diagram of a network environment offering several communication protocol options and mobile information handling systems according to an embodiment of the present disclosure.

FIG. 2 illustrates a network 200 that can include one or more endpoint devices 210, 220, 230. The endpoint devices 210, 220, 230 shown in FIG. 2 may be similar to the information handling system 100 described in connection with FIG. 1. In a particular embodiment, network 200 includes networked mobile endpoint devices 210, 220, 230, wireless network access points, and multiple wireless connection link options. A variety of additional computing resources of network 200 may include client mobile information handling systems, data processing servers, network storage devices, local and wide area networks, a RAN service provider, or other resources as needed or desired. As partially depicted, endpoint devices 210, 220, 230 may be a laptop computer, tablet computer, 360-degree convertible systems, wearable computing devices, or a smart phone device. These mobile endpoint devices 210, 220, 230, may access a wireless local network 240, or they may access a macro-cellular network 250. For example, the wireless local network 240 may be the wireless local area network (WLAN), a wireless personal area network (WPAN), or a wireless wide area network (WWAN). In an example embodiment, LTE-LAA WWAN may operate with a small-cell WWAN wireless access point option. In an embodiment, these networks may provide cloud computing resources for the individual mobile endpoint devices 210, 220, 230.

Since WPAN or Wi-Fi Direct connection 248 and WWAN networks can functionally operate similar to WLANs, they may be considered as wireless local area networks (WLANs) for purposes herein. Components of a WLAN may be connected by wireline or Ethernet connections to a wider external network such as a voice and packet core 280. For example, wireless network access points or base stations may be connected to a wireless network controller and an Ethernet switch. Wireless communications across wireless local network 240 may be via standard protocols such as IEEE 802.11 Wi-Fi, IEEE 802.11ad WiGig, IEEE 802.15 WPAN, IEEE 802.11ax-2021, (e.g., Wi-Fi 6 and 6E, 6 GHz technologies), or 5G small cell WWAN communications such as gNodeB, eNodeB, or similar and future wireless network protocols and access points. Alternatively, other available wireless links within network 240 may include macro-cellular connections 250 via one or more service providers 260 and 270. Again, as described herein, the organization of a number of endpoint devices 210, 220, 230 may be defined by the endpoint devices 210, 220, 230 accessing a specific or number of specific base stations. As described herein, the endpoint devices 210, 220, 230 may be operatively coupled to any of the macro-cellular connections 250 via one or more service providers 260 and 270 or to the wireless local area networks (WLANs) selectively. Service provider macro-cellular connections may include 2G standards such as GSM, 2.5G standards such as GSM EDGE and GPRS, 3G standards such as W-CDMA/UMTS and CDMA 2000, 4G standards, or emerging 5G standards including WiMAX, LTE, and LTE Advanced, LTE-LAA, small cell WWAN, upcoming 3GPP protocols, and the like.

Wireless local network 240 and macro-cellular network 250 may include a variety of licensed, unlicensed or shared communication frequency bands as well as a variety of wireless protocol technologies ranging from those operating in macrocells, small cells, picocells, or femtocells. As described herein, utilization of RF communication bands according to several example embodiments of the present disclosure may include bands used with the WLAN standards and WWAN carriers which may operate in both licensed and unlicensed spectrums. For example, both WLAN and WWAN may use the Unlicensed National Information Infrastructure (U-NII) band which typically operates in the ~5 MHz frequency band such as 802.11 a/h/j/n/ac/ax (e.g., center frequencies between 5.170-7.125 GHz). WLAN, for example, may operate at a 2.4 GHz band, 5 GHz band, and/or a 6 GHz band according to, for example, Wi-Fi, Wi-Fi 6, or Wi-Fi 6E standards. WWAN may operate in a number of bands, some of which are proprietary but may include a wireless communication frequency band. For example, low-band 5G may operate at frequencies similar to 4G standards at 600-850 MHz or, in an embodiment, 960 Mhz. Mid-band 5G may operate at frequencies in an FR1 range between 1.8 and 6 GHz. Additionally, high-band 5G frequencies may operate at 25 to 39 GHz and even higher.

In additional examples, WWAN carrier licensed bands may operate at the new radio frequency range 1 (NRFR1), NRFR2, bands, and other known bands as described herein per the operation of the 5G protocol standards for a 5G radio module. Each of these frequencies used to communicate over the network 240 may be based on the radio access network (RAN) standards that implement, for example, eNodeB or gNodeB hardware connected to mobile phone networks (e.g., cellular networks) used to communicate with the endpoint devices 210, 220, 230. In the example embodiment, mobile endpoint devices 210, 220, 230 may also include both unlicensed wireless RF communication capabilities as well as licensed wireless RF communication capabilities. For example, licensed wireless RF communication capabilities may be available via a subscriber carrier wireless service operating the cellular networks. With the licensed wireless RF communication capability, an WWAN RF front end of the endpoint devices 210, 220, 230 may operate on a licensed WWAN wireless radio with authorization for subscriber access to a wireless service provider on a carrier licensed frequency band. WLAN such as Wi-Fi (e.g., Wi-Fi 6) may be unlicensed.

In some embodiments according to the present disclosure, a networked mobile endpoint device 210, 220, 230 may each have a plurality of wireless network interface systems or radio protocol subsystems capable of transmitting simultaneously within several communication bands or even utilizing a shared communication frequency band access multiple protocols. That communication within a shared communication frequency band may be sourced from different protocols on parallel wireless network interface systems or from a single wireless network interface system capable of transmitting and receiving from multiple protocols. Similarly, a single antenna or the plurality of antennas in each endpoint device 210, 220, 230 may be used on each of the wireless communication devices such as according to embodiments herein and may be suited to plural RF bands. As described herein, each of the endpoint devices 210, 220, 230 may include a 5G antenna that are capable of transmitting and receiving data using an FR1 and FR2 frequency concurrently to communicate with multiple networks. Example competing protocols may be local wireless network access protocols such as Wi-Fi/WLAN, WiGig, and small cell WWAN in an unlicensed, shared communication frequency band. Within local portion of wireless network 250 access points for Wi-Fi or WiGig as well as small cell WWAN connectivity may be available in 5G technology or emerging 6G technology. This may create situations where a plurality of antenna systems are operating on an endpoint device 210, 220, 230 via concurrent communication wireless links on both WLAN and WWAN radios and antenna systems. In some embodiments, concurrent wireless links may operate within the same, adjacent, or otherwise interfering communication frequency bands. The antenna may be a transmitting antenna that includes high-band, medium-band, low-band, and unlicensed band transmitting antennas in embodiments herein. In an embodiment, the antenna may be an active antenna such as the active antenna described in connection with FIG. 1. The antenna may cooperate with other antennas in a N×N MIMO (where "N" is any number) array configuration according to the embodiments described herein. Alternatively, embodiments may include a single transceiving antenna capable of receiving and transmitting, and/or more than one transceiving antennas. Each of the antennas included in the endpoint devices 210, 220, 230 in an embodiment may be subject to the FCC regulations on specific absorption rate (SAR).

The voice and packet core network 280 shown in FIG. 2 may contain externally accessible computing resources such as containerize applications that may execute at edge compute resources 284 or connect to a remote data center 286. The voice and packet core network 280 may contain multiple intermediate web servers or other locations with accessible data (not shown). The voice and packet core network 280 may also connect to other wireless networks similar to 240 or 250 and additional mobile endpoint devices 210, 220, 230 or similar connected to those additional wireless networks. Connection 282 between the wireless network 240 and edge compute resources 284 or remote data center 286 or connection to other additional wireless networks may be via Ethernet or another similar connection to the world-wide-web, a WAN, a LAN, another WLAN, or other network structure. Such a connection 282 may be made via a WLAN access point/Ethernet switch to the external network and includes a backhaul connection. The access point may be connected to one or more wireless access points in the WLAN before connecting directly to a mobile information handling system or may connect directly to one or more mobile endpoint devices 210, 220, 230. Alternatively, mobile endpoint devices 210, 220, 230 may connect to the external network via base station locations at service providers such as 260 and 270. These service provider locations may be network connected via backhaul connectivity through the voice and packet core network 280.

Remote data centers 286 may include web servers or resources within a cloud environment that operate via the voice and packet core 280 or other wider internet connectivity. For example, remote data centers 286 can include additional information handling systems, data processing servers, network storage devices, local and wide area networks, or other resources as needed or desired. In an embodiment, the remote data center 286 may include one or more servers.

Edge compute systems 284, in an embodiment, may be used to offload processing requirements for each of the mobile endpoint devices 210, 220, 230 described herein. In this embodiment, the edge compute systems 284 may be any computing system or distributed computing systems that places the processing and data storage resources within the network 240 and 250 closer to the mobile endpoint devices 210, 220, 230 to improve response times and save bandwidth while offloading processing of data from the mobile endpoint devices 210, 220, 230 to these edge compute systems 284. In an embodiment, containerized software applications may be executed on the edge compute systems 284 as a bundle of application code, configuration files, libraries, and dependencies used to execute those containerized software applications. During operation of the mobile endpoint devices 210, 220, 230, any applicable containerized software application may be accessed by the respective processing devices in the mobile endpoint devices 210, 220, 230.

Having such edge compute or remote capabilities may permit fewer resources to be maintained at the mobile endpoint devices 210, 220, 230 allowing streamlining and efficiency within those devices. Similarly, remote data center permits fewer resources to be maintained in other parts of network 200. Thus, high data bandwidth wireless links are desired for endpoint devices 210, 220, 230 to interface with greater and greater resources located on a network edge or as a remote data center. This requires more antennas, more power, and more heat, in less space within the endpoint devices 210, 220, 230.

Although network connections 215, 225, and 235 are shown connecting wireless adapters of mobile endpoint devices 210, 220, 230 to wireless networks 240 or 250, a variety of wireless links are contemplated. Wireless communication may link through a wireless access point (Wi-Fi or WiGig), through unlicensed WWAN small cell base stations such as in network 240 or through a service provider tower and base stations such as that shown with service provider A 260 or service provider B 270 and in network 250. In other aspects, mobile endpoint devices 210, 220, 230 may communicate intra-device via intra-device connections 248 when one or more of the mobile endpoint devices 210, 220, 230 are set to act as an access point or even potentially an WWAN connection via small cell communication on licensed or unlicensed WWAN connections. For example, one of the endpoint devices 210, 220, 230 may serve as a Wi-Fi hotspot in an embodiment. Concurrent wireless links to the endpoint devices 210, 220, 230 may be connected via any access points including other mobile information handling systems as illustrated in FIG. 2.

Figure 3:
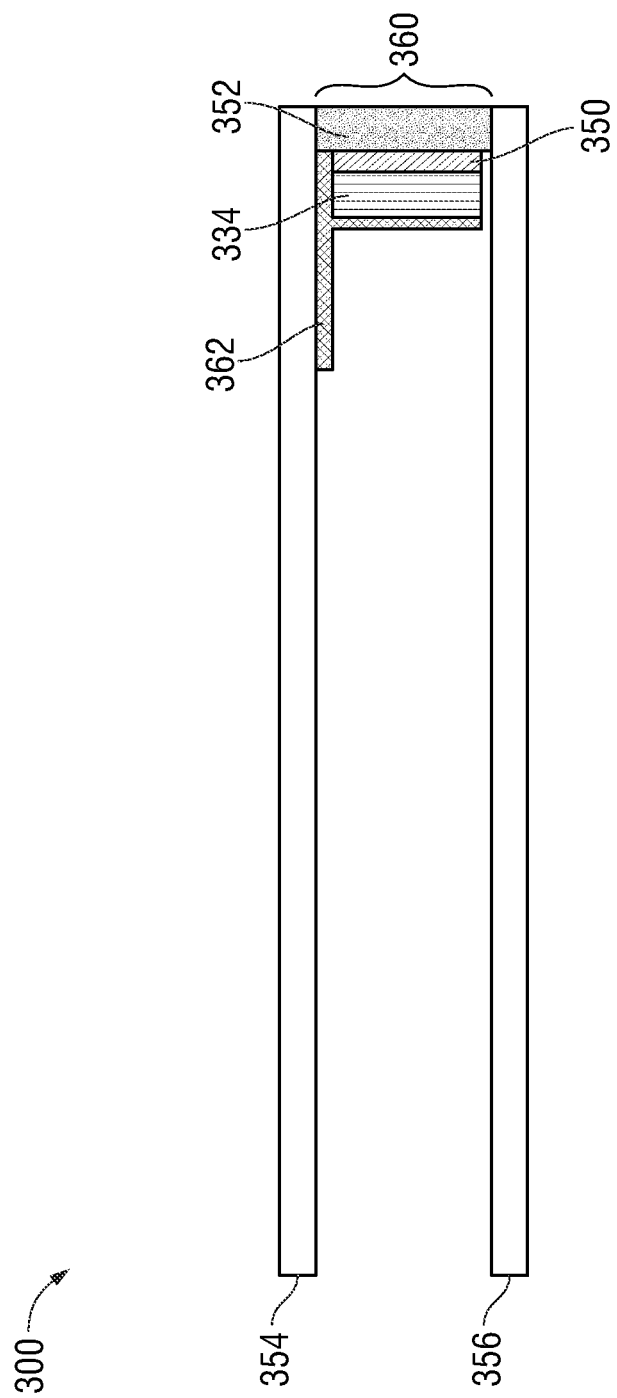
FIG. 3 is a block diagram cross-section view of an antenna cooling system within a chassis of an information handling system according to an embodiment of the present disclosure.

FIG. 3 is a block diagram cross-section of an antenna cooling system within the information handling system 300 chassis according to an embodiment of the present disclosure. FIG. 3 shows a portion of the information handling system with a top chassis skin layer 354 (e.g., a c-cover) and a bottom chassis skin layer 356 (e.g., a d-cover) forming the information handling system chassis of, for example, a base chassis of a laptop-type information handling system. In this embodiment, either or both of the top chassis skin layer 354 and bottom chassis skin layer 356 may be made of metal such that heat dissipated from the active antenna system 334 is dissipated by the relatively larger surface area of the top chassis skin layer 354 and bottom chassis skin layer 356;

As described in the embodiments herein, a radio module is operatively coupled to the active antenna system 334 with a radio subsystem and front end operatively coupled to or housed within the radio module. In an example embodiment, the radio module may be a 5G mmWave radio module or active antenna system 334. In an example embodiment, the radio module may be a long-term evolution (LTE) protocol radio module or any other type of radio module. In an embodiment described herein, the active antenna system 334 may further include, for example, a an antenna or array of antennas or other heat-producing circuitry that, during operation, creates an amount of heat. This heat is created when the antenna or other circuitry of the active antenna system 334 is transmitting data, processing that data, or converting that digital data received from the processor into RF signals used to transmit that data wirelessly via the active antenna system 334 associated with the radio module. It is this heat created during operation of the active antenna system 334 that the thermally conductive and RF transparent thermal pad 350 and thermally conductive and RF transparent window 352 (among other devices) described herein are used to dissipate an amount of heat away from the active antenna system 334 as described herein.

In one embodiment described herein, the active antenna system 334 and antenna or antennas is operatively coupled to a thermally conductive and RF transparent thermal pad 350. This thermally conductive and RF transparent thermal pad 350 may be made of any thermally conductive material that directs heat away from the active antenna system 334 and dissipates that heat into the thermally conductive and RF transparent window 352. In another embodiment, a thermally heat conductive adhesive may be used to secure the active antenna system 334 and antenna or antennas to the thermally conductive and RF transparent window 352 while also transmitting heat away from the active antenna system 334 and dissipated into the thermally conductive and RF transparent window 352. In an embodiment, the thermally conductive and RF transparent thermal pad 350 or heat conductive adhesive may be made of a thermally conductive material such as silicone, paraffin wax, and acrylic among others. The adhesives may be any type of adhesive that allows for transmission of heat from the active antenna system 334 to the thermally conductive and RF transparent window 352. These thermally conductive and transmissive adhesives may include an epoxy resin, a glue including a metal oxide, silica, or ceramic microspheres, among others.

As described, the thermally conductive and RF transparent thermal pad 350 or thermally heat conductive adhesive may transmit heat into the thermally conductive and RF transparent window 352. The thermally conductive and RF transparent window 352 may be made of any thermally conductive material that, in an embodiment, transmits heat into a chassis of the information handling system 300. In an embodiment, the thermally conductive and RF transparent window 352 may be made of a liquid-crystal, metal-dioxide, polymer-based plastic. This plastic may be opaque, colored, or clear. The thermally conductive and RF transparent window 352 may include any metal-oxide that is infused into the plastic and acts as a heat sink to receive heat from the thermally conductive and RF transparent thermal pad 350 or thermally heat conductive adhesive. Because the metal-oxide is infused into the liquid-crystal polymer-based plastic and because the metal oxide is RF transparent, the metal-oxide does no inhibit the transmission and reception of data from and to the active antenna system 334. The chemical properties of the thermally conductive and RF transparent window 352, however, do transmit heat from the active antenna system 334 and into the chassis of the information handling system 300. In an embodiment, the thermally conductive and RF transparent window 352 may be made of COOLPOLY® D5506 manufactured by Celanese®.

In one embodiment, the thermally conductive and RF transparent window 352 may be placed within a hole or aperture 360 formed in a sidewall of the top chassis skin layer 354 of the chassis of the information handling system 300. In one embodiment, the thermally conductive and RF transparent window 352 may be injection molded into the aperture 360. In an embodiment, the thermally conductive and RF transparent window 352 may be inserted into the aperture 360 and held therein using a glue or other adhesive including the thermally conductive adhesives described herein. In another embodiment, the thermally conductive and RF transparent window 352 may be press fit, snap fit, or held into the aperture 360 formed in the sidewall of the chassis using a fastening device such as a bracket, screw, bolt, or nail. In an embodiment, the thermally conductive and RF transparent window 352 may be placed within any chassis of the information handling system so that the location may optimize the transmission capabilities of the antenna. For example, the aperture 360 and thermally conductive and RF transparent window 352 may be placed within a top chassis, a bottom chassis, or a sidewall of either chassis. Still further, in an embodiment, the shape of the aperture and its thermally conductive and RF transparent window 352 may be formed to optimize the transmission and reception capabilities of the antenna. In an embodiment, the thermally conductive and RF transparent window 352 may be sized to accommodate for any size of antenna thereby optimizing the transmission and reception capabilities of the antenna or antennas. In an embodiment, the thermally conductive and RF transparent window 352 may be placed within an aperture formed in the bottom chassis skin layer 356 of the chassis of the information handling system 300. In these embodiments, either of the top chassis skin layer 354 or bottom chassis skin layer 356 may be made of metal so that heat at the thermally conductive and RF transparent window 352 may be dissipated into the chassis of the information handling system 300. In an embodiment, because the top chassis skin layer 354 may be touched by the user, the top chassis skin layer 354 may be made of a plastic or a glass while the bottom chassis skin layer 356 is made of metal. In order to prevent heat from dissipating into the top chassis skin layer 354, in one optional embodiment, the antenna cooling system comprising the thermally conductive and RF transparent thermal pad 350 and thermally conductive and RF transparent window 352 may further include a layer of aerogel 362 to prevent heat from the thermally conductive and RF transparent window 352 from dissipating into the top chassis skin layer 354. In another embodiment, a layer of aerogel 362 may also be placed behind the active antenna system 334 to prevent heat from dissipating into an interior of the chassis of the information handling system 300.

The size of the antenna cooling system may be significantly smaller than if the active antenna system 334 was cooled using a heat sink placed behind the active antenna system 334, for example, to the left of the active antenna system 334 in FIG. 3 and internal to the chassis. Further, the active antenna system 334 and thermally conductive and RF transparent window 352 described herein limits heat dissipating into the chassis of the information handling system 300 while the use of a heat sink placed behind the active antenna system 334 would direct heat into the chassis with the need of another cooling device to dissipate that heat away from the interior of the chassis. In embodiments where the top chassis skin layer 354 and bottom chassis skin layer 356 are both made of metal the heat may be dissipated over a much greater amount of surface area and the heat dissipated into the top chassis skin layer 354 may be low enough to not injure or make a user uncomfortable if touched.

Figure 4:
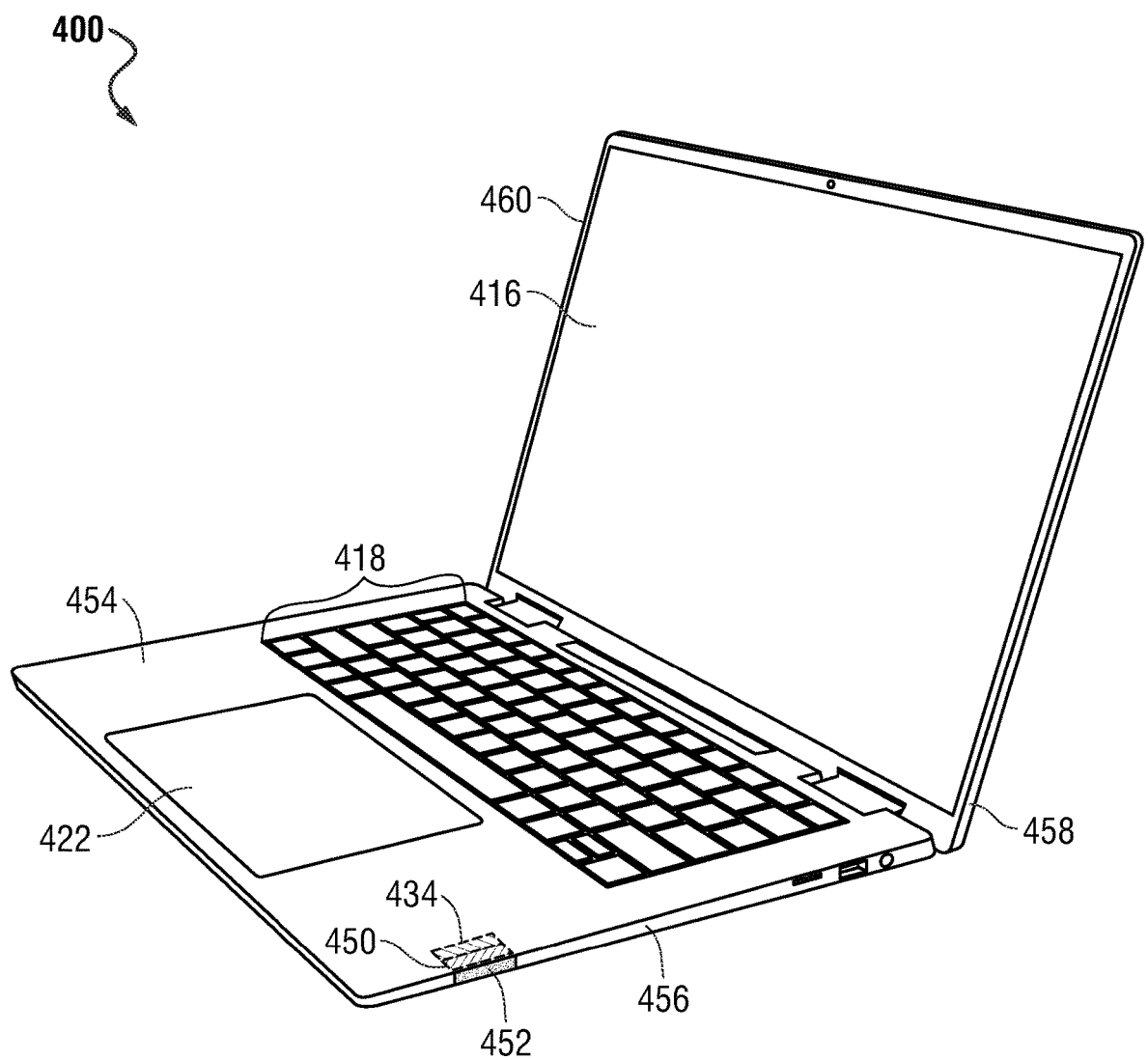
FIG. 4 is a graphic diagram indicating a location of an antenna cooling system an antenna within an information handling system according to another embodiment of the present disclosure.

FIG. 4 is a graphic diagram of an antenna cooling system within the information handling system 400 according to another embodiment of the present disclosure. As shown in FIG. 4, the information handling system 400 includes a hole or aperture formed into a sidewall of one of the c-cover 454 or d-cover 456. In an embodiment, the thermally conductive and RF transparent window 452 is placed into this aperture via injection molding or secured using any type of coupling device or adhesive. In order to increase the aesthetics of the information handling system 400, the thermally conductive and RF transparent window 452 may be colored to match the metallic color of the c-cover 454 and/or d-cover 456. In an embodiment, the thermally conductive and RF transparent window 452 may be made opaque. In an embodiment, the aperture into which the thermally conductive and RF transparent window 452 is placed within may be formed into a sidewall of a chassis. For example, this chassis may include a top chassis skin layer (e.g., a c-cover) and a bottom chassis skin layer (e.g., a d-cover), or a combination thereof. In an embodiment, the aperture into which the thermally conductive and RF transparent window 452 is placed within may be formed into a back chassis skin layer (e.g., an a-cover) of a display chassis or a front chassis skin layer (e.g., a b-cover) of the display chassis. In the embodiments herein the shape and size of the aperture formed into a chassis of the information handling system 400 may be formed to optimize the transmission and reception of data by the active antenna system 434.

The information handling system 400 shown in FIG. 4 is a depicted as a laptop-type information handling system 400. However, the present specification contemplates that the information handling system 400 may be any type of device including, but not limited to a desktop computing device and mobile computing device such as a smartphone. The information handling system 400 depicted in FIG. 4, in an embodiment, shows the laptop-type information handling system 400 includes a display housing or chassis that includes an "a-cover" which serves as a back cover for the display chassis and a "b-cover" which may serve as the bezel, if any, and a display screen 416 of the information handling system 400. The laptop information handling system 400 chassis may include the c-cover 454 housing a keyboard 418, touchpad 422, speaker grill, and any cover in which these components are set and the d-cover 456 base housing for the laptop information handling system 400 which may house processors (e.g., central processing units (CPU) or graphic processing unit (GPU)), memory, a wireless interface adapter, a PMU, and other components of the information handling system.

In this embodiment, a location of the active antenna system 434 or adhesive in some embodiments and the location of the thermally conductive and RF transparent thermal pad 450 (herein called the thermally conductive and RF transparent thermal pad 450) are shown located behind the thermally conductive and RF transparent window 452. In an embodiment, the active antenna system 434 antenna(s), radio module, and the thermally conductive and RF transparent thermal pad 450 or adhesive may be placed and housed within a sub-housing within the base chassis and may include electromagnetic (EM) cage or other inhibitor to prevent RF signals from the active antenna system 434 from effecting the operation of the other components housed within the base chassis or the EM fields from those other components effecting the operation of the active antenna system 434 or radio module.

The active antenna system 434 and antenna or antennas, in one embodiment, may be operatively coupled to the thermally conductive and RF transparent window 452 via and thermally heat conductive adhesive. In another embodiment, the thermally conductive and RF transparent thermal pad 450 may include a thermally heat conductive adhesive that operatively couples the active antenna system 434 to the thermally conductive and RF transparent thermal pad 450 as well as the thermally conductive and RF transparent thermal pad 450 to the thermally conductive and RF transparent window 452.

The information handling system 400 may include more than one active antenna system 434 or more than one associated antenna and more than one thermally conductive and RF transparent window 452 antenna cooling system than that shown in FIG. 4. In this embodiment, the plurality of active antenna systems 434 or antennas may each be arranged as depicted in FIG. 4. Additionally, these active antenna systems 434 or plurality of antennas may cooperate to communicate with a network using a MIMO configuration such that data may be transmitted more effectively and at relatively higher frequencies. To do so, each active antenna system 434 may include a tuning module (not shown) to tune the plural antennas so as to transceive data through the one or more thermally conductive and RF transparent window 452 and thermally conductive and RF transparent thermal pad 450 effectively and in coordination with each other depending on whether plural active antenna systems 434 are under one active antenna system 434 with plural antennas. Still further, the tuning module may be used to active antennas so as to transceive data through the thermally conductive and RF transparent window 452 and thermally conductive and RF transparent thermal pad 450 effectively when operated individually.

In an embodiment, in order to prevent heat from dissipating into the c-cover 454, in this embodiment, the antenna cooling system comprising the thermally conductive and RF transparent thermal pad 450 and thermally conductive and RF transparent window 452 may further include a layer of aerogel (not shown) to prevent heat from the thermally conductive and RF transparent window 452 from dissipating into the c-cover 454. In an embodiment, a layer of aerogel may also be placed behind the active antenna system 434 to prevent heat from dissipating into an interior of the chassis of the information handling system 400.

Figure 5:
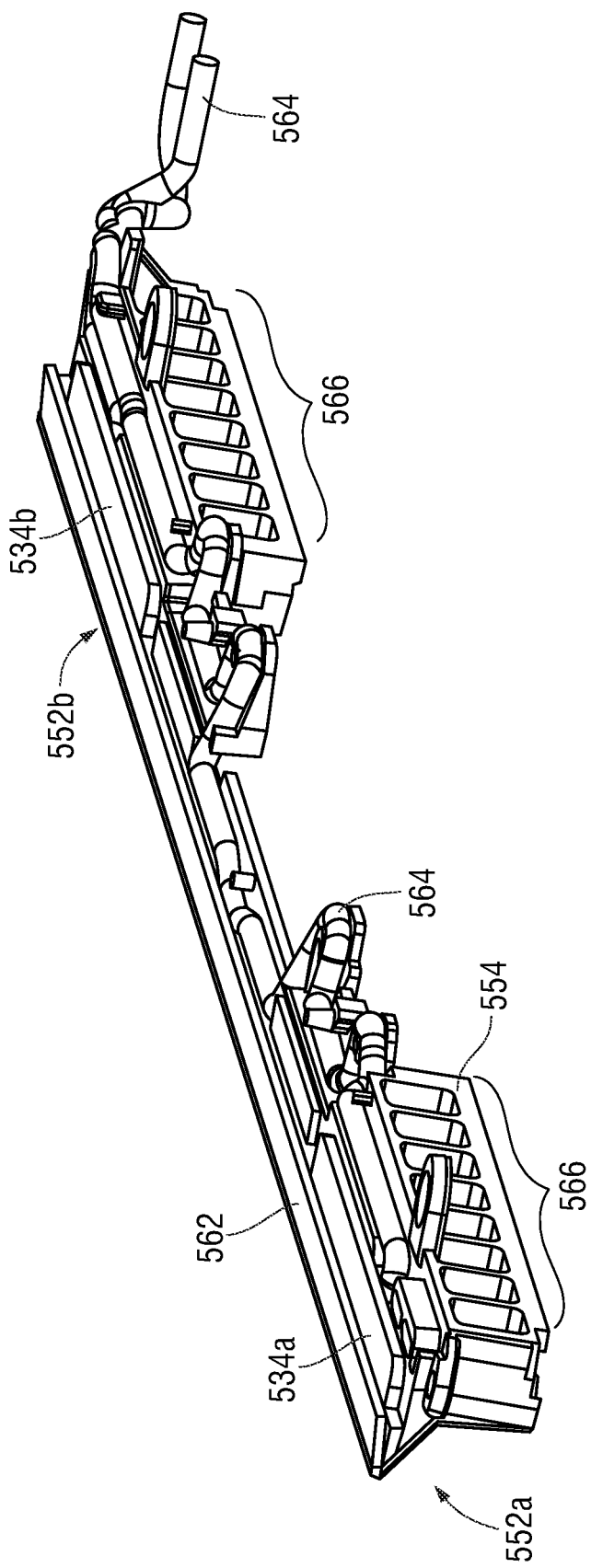
FIG. 5 is a graphic diagram of an active antenna system operatively coupled with a cooling system according to another embodiment of the present disclosure.

FIG. 5 is a graphic diagram of an active antenna system 534 to be operatively coupled within a sidewall 554 according to another embodiment of the present disclosure. FIG. 5 shows only a portion of the sidewall 554 of an information handling system where the active antenna system 534 would be operatively coupled to the c-cover on the top of the sidewall 554 and with side vents 566 of the sidewall 554.

The embodiment shown in FIG. 5 shows a plurality of active antenna systems 534(*a*) and 534(*b*) coupled to this sidewall 554 under where the c-cover would be placed. Each of these antennas may include a coaxial cable 564 or other lead to operatively couple each active antenna systems 534(*a*) and 534(*b*) to a radio module within the chassis of the information handling system. As described herein, the active antenna systems 534(*a*) and 534(*b*) may be placed within a sub-housing of the chassis of the information handling system. The active antenna systems 534(*a*) and 534(*b*) may be operatively coupled to a thermally conductive and RF transparent thermal pad (not shown) which is also operatively coupled to a thermally conductive and RF transparent windows 552(*a*) and 552(*b*) located around back and placed or formed within an aperture formed in the sidewall 554 (or alternatively a d-cover or c-cover). FIG. 5 shows an aerogel layer 562 operatively coupled under where the c-cover would be installed. As described herein, the aerogel layer 562 prevents the transmission of heat into components of the information handling system as well as to the chassis c-cover housing the active antenna systems 534(*a*) and 534(*b*). As shown in FIG. 5, the aerogel layer 562 prevents heat from being dissipated up to the c-cover location and potentially increasing the heat felt by a user if touched. This heat may, instead, be dissipated from the sidewall 554 into a d-cover (not shown) and away from the user.

In an embodiment, the thermally conductive and RF transparent windows 552(*a*) and 552(*b*) located around to back may be formed into the sidewall 554 which may be a sidewall of the c-cover. In other embodiments, the thermally conductive and RF transparent window may be formed in other locations along the surface of any of the parts of the d-cover, c-cover, sidewall, or other portions of the chassis. In an embodiment, the combined use of the aerogel layer 562 and the thermally conductive and RF transparent window will direct heat into an outer surface of the chassis such as a metallic d-cover or a metallic c-cover to radiate and cool and away from the internal components of the information handling system.

Because the active antenna systems 534(*a*) and 534(*b*) is placed distant from the radio module and operatively coupled to the radio module by the coaxial cables 564, the active antenna systems 534(*a*) and 534(*b*) may include other circuitry to enhance the transmission capabilities of the active antenna systems 534(*a*) and 534(*b*) especially where the signal may be degraded when transmitted via the coaxial cables 564 to the active antenna systems 534(*a*) and 534(*b*). Accordingly, the active antenna systems 534(*a*) and 534(*b*) may include a tuner, a processing device, amplifying circuitry, among other types of circuitries. As described herein, this other circuitry along with the antennas may create an amount of heat. This heat is created when antenna and the circuitry of the active antenna systems 534(*a*) and 534(*b*) is transmitting, receiving data, processing that data, or converting that digital data received from the processor into radio frequency (RF) signals used to transmit that data wirelessly via the active antenna systems 534(*a*) and 534(*b*) associated with the radio module. It is this heat created during operation of the active antenna systems 534(*a*) and 534(*b*) that the thermally conductive and RF transparent windows 552(*a*) and 552(*b*) and thermally conductive and RF transparent thermal pad (not shown) among other devices described herein are used to dissipate an amount of heat away from the active antenna systems 534(*a*) and 534(*b*) as described herein.

Figure 6:
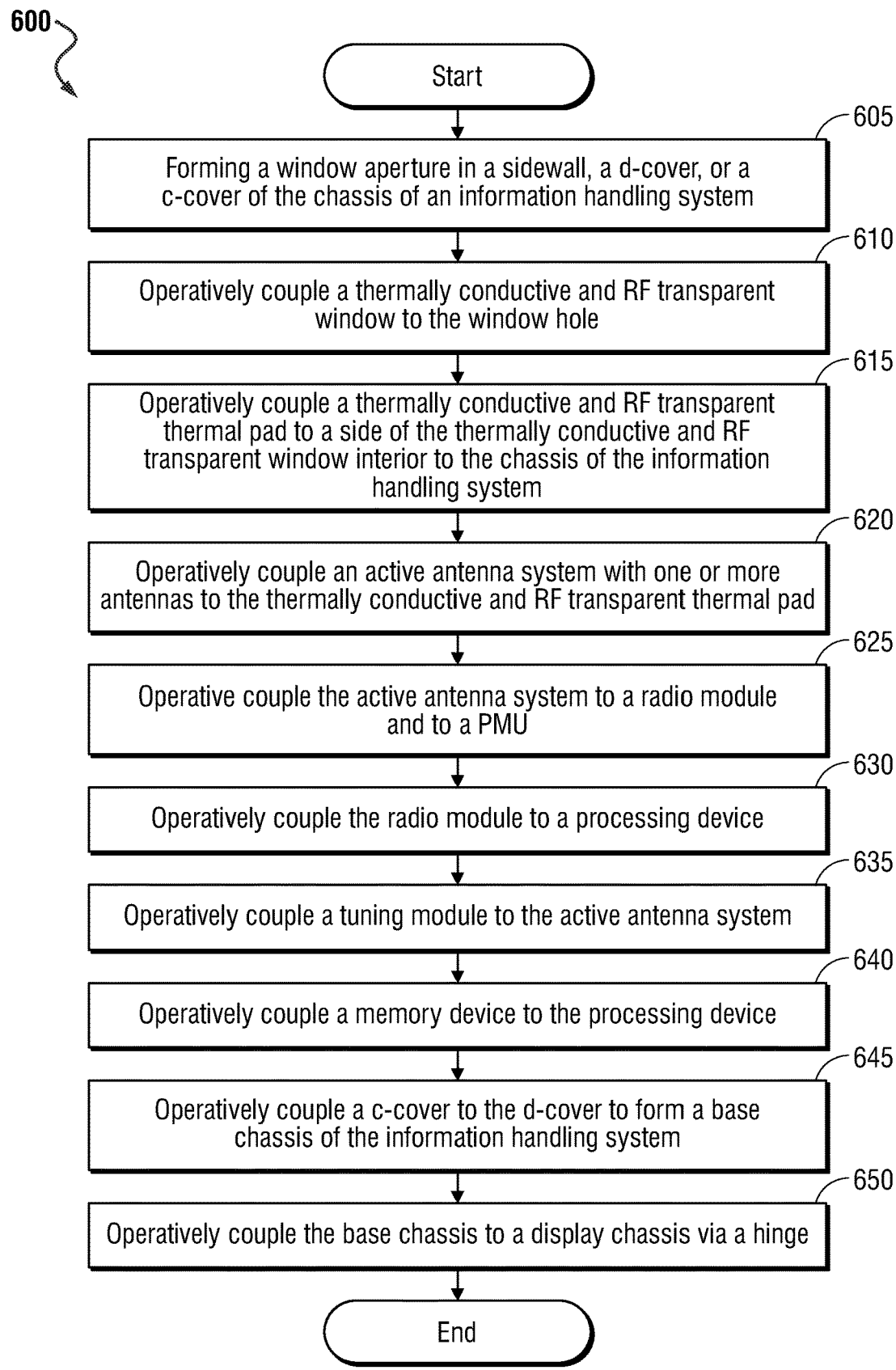
FIG. 6 is a flow diagram illustrating a method of manufacturing an information handling system with an antenna cooling system according to an embodiment of the present disclosure.

FIG. 6 is a flow diagram illustrating a method 600 of manufacturing an information handling system with an antenna cooling system according to an embodiment of the present disclosure. The method 600 may include forming an antenna window aperture into a wall of a suitable chassis of the information handling system at block 605. The antenna window aperture may be formed on any of a sidewall, a d-cover, a c-cover of the information handling system chassis. In any of these embodiments, the c-cover and d-cover may be made of metal so that heat may be dissipated into one or both of these portions of the information handling system chassis. Other embodiments include a c-cover that is made of plastic or glass while the d-cover is made of metal to allow heat to be dissipated via the d-cover.

At 610, the method 600 may also include operatively coupling a thermally conductive and RF transparent window or forming the same into the window aperture formed at block 615. In an embodiment, the thermally conductive and RF transparent window may be injection molded into the window aperture. The thermally conductive and RF transparent window may be secured into the window aperture via use of any coupling device or an adhesive in other embodiments. In one embodiment, the thermally conductive and RF transparent window may be coupled into the window aperture via use of a thermally heat conductive adhesive. This may allow heat to be transmitted from the thermally conductive and RF transparent window into the chassis of the information handling system.

As described herein, the thermally conductive and RF transparent window may be made of any thermally conductive material that, in an embodiment, transmits heat into a chassis of the information handling system. In an embodiment, the thermally conductive and RF transparent window may be made of a liquid-crystal, metal-dioxide, polymer-based plastic. This plastic may be opaque, colored, or clear. The thermally conductive and RF transparent window may include any metal-oxide that is infused into the plastic and acts as a heat sink to receive heat from the thermally conductive and RF transparent thermal pad or thermally heat conductive adhesive. Because the metal-oxide is infused into the liquid-crystal polymer-based plastic and because the metal oxide is RF transparent, the metal-oxide does no inhibit the transmission and reception of data from and to the active antenna system. The chemical properties of the thermally conductive and RF transparent window, however, do transmit heat from the active antenna system and into the chassis of the information handling system. In an embodiment, the thermally conductive and RF transparent window may be made of COOLPOLY® D5506 manufactured by Celanese®.

The method 600 may include, at block 615, operatively coupling a thermally conductive and RF transparent thermal pad to a side of the thermally conductive and RF transparent window interior to the chassis of the information handling system. Again, in an embodiment, the thermally conductive and RF transparent thermal pad may be coupled to the thermally conductive and RF transparent window via a thermally heat conductive adhesive. The thermally conductive and RF transparent thermal pad may be made of any thermally conductive material that directs heat away from the active antenna system and dissipates that heat into a thermally conductive and RF transparent window. In an embodiment, a thermally heat conductive adhesive may be used to secure the active antenna system to the thermally conductive and RF transparent window while also transmitting heat away from the active antenna system and dissipated into the thermally conductive and RF transparent window. In an embodiment, the thermally conductive and RF transparent thermal pad or heat conductive adhesive may be made of a thermally conductive material such as silicone, paraffin wax, and acrylic among others. The adhesives described herein may be any type of adhesive that allows for transmission of heat from the active antenna system to the thermally conductive and RF transparent window. These thermally conductive and transmissive adhesives may include an epoxy resin, a glue including a metal oxide, silica, or ceramic microspheres, among others.

At block 620, the method 600 includes operatively coupling the active antenna system with one or more antennas to the thermally conductive and RF transparent thermal pad. This active antenna system may include additional circuitry apart from the antenna or antennas. As described herein, the active antenna system may include a processing device or other heat-producing circuitry such as a tuning module. This heat, if not dissipated, may damage the antenna system or other components of the information handling system or generate heating that injures or causes discomfort to the user. In an embodiment described herein, the active antenna system is operatively coupled to a thermally conductive and RF transparent thermal pad via a coupling device or via a thermally heat conductive adhesive in order to transmit heat from the active antenna system.

In an embodiment, the active antenna system may include circuitry used to enhance the transmission capabilities of the active antenna system or antennas. Accordingly, the active antenna system may include a tuner, a processing device, amplifying circuitry, among other types of circuitries. As described herein, this other circuitry also creates an amount of heat in addition to that created by the antenna or antennas transmitting at high data bandwidths. This heat is created when the antenna or antennas and the circuitry of the active antenna system is transmitting data, processing that data, or converting that digital data received from the processor into radio frequency (RF) signals used to transmit that data wirelessly via the active antenna system associated with the radio module. It is this heat created during operation of the active antenna system and antenna or antennas that the optional thermally conductive and RF transparent thermal pad and thermally conductive and RF transparent window among other devices described herein are used to dissipate an amount of heat away from the active antenna system as described herein.

The method 600 may further include, at block 625, with operatively coupling the active antenna system to the radio module and to the PMU. In an embodiment, a coaxial cable may be used to operatively couple the antenna system to a RF front end of the radio module associated with the described active antenna systems and its antennas as well as the PMU. The PMU may manage the power provided to the components of the information handling system such as the processor, components of a cooling system such as a fan, one or more disk drive units, a graphical processing unit (GPU), a video/graphic display device or other I/O device such as a stylus, and other components that may require power when a power button has been actuated by a user such as the components of the active antenna system and wireless interface adapter and radio module as described herein. In an embodiment, the PMU may monitor power levels and be electrically coupled to the information handling system to provide this power and coupled to a bus to provide or receive data or instructions. The PMU may regulate power from a power source such as a battery or A/C power adapter. In an embodiment, the battery may be charged via the A/C power adapter and provide power to the components of the information handling system via wired connections as applicable, or when A/C power from the A/C power adapter is removed.

In an embodiment, the method 600 includes operatively coupling the active antenna system to a processing device via the radio module and wireless interface adapter at block 630. The processing device may include a CPU of the information handling system, an antenna controller or any other type of processing device. In an embodiment, the processing device may be operatively coupled to the radio module of the wireless interface adapter active antenna system via a bus such as the bus described in connection with FIG. 1. In an embodiment, the processing device is a dedicated processor used to control the data signals to the radio module of the wireless interface adapter and active antenna system.

The method 600 further includes, at block 635, operatively coupling a tuning module to the active antenna system. In an embodiment, tuning module is used to tune the antenna or antennas of the active antenna systems so as to transceive data through the thermally conductive and RF transparent window and optional thermally conductive and RF transparent thermal pad effectively. As described, this tuning module may be used in coordination with other antennas or active antenna systems where multiple antennas are coordinated as a MIMO antenna arrangement as described herein.

As described herein, the method 600 includes operatively coupling a memory device to the processing device at block 640. The memory (volatile (e.g., random-access memory, etc.), nonvolatile (read-only memory, flash memory etc.) or any combination thereof), one or more processing resources, such as a central processing unit (CPU), a graphics processing unit (GPU), hardware or software control logic, or any combination thereof may be included.

The method 600 further includes operatively coupling a c-cover to the d-cover to form a base chassis of the information handling system at block 645. This forms a base chassis of a laptop-type information handling system as described herein. In this embodiment, the base chassis may house a number of other devices including the CPU, the data storage device, the active antenna system, the antenna cooling system, speakers, a keyboard, a touchpad, among other devices.

In example embodiments described herein, a form factor case of the information handling system may include an a-cover, a b-cover, a c-cover, and a d-cover as described herein. The method 600 includes, at block 645, operatively coupling a c-cover to a d-cover to form a base chassis of the information handling system. By coupling the c-cover to the d-cover, the base portion of the information handling system has now encased the components of the information handling system such as the radio module, the fan housing, the fan, the processor or CPU, data storage devices, other radio modules, a battery, speakers and other devices such as the I/O devices described herein.

At block 650, the method 600 further includes coupling the base chassis to a display chassis via a hinge. As described herein, the information handling system may be a laptop-type information handling system. In this example, embodiment, the laptop-type information handling system may include a base portion with a display portion, with an a-cover and a b-cover, operatively coupled to the base portion via a hinge mechanism. This may allow a user to view the video display device of the display portion while providing input to the information handling system via, for example, the haptic touchpad described herein. At this point the method 600 may end.

The blocks of the flow diagrams of FIG. 6 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An information handling system with an antenna cooling system, comprising:
    a processor;
    a memory;
    a power management unit (PMU) operatively coupled to the processor;
    a wireless interface adapter with a radio module within a chassis of the information handling system;
    an active antenna system with an antenna mounted at an aperture in a wall of the chassis of the information handling system;
    a thermally conductive and radio frequency (RF) transparent window formed seamlessly within the aperture in the wall of the chassis of the information handling system, where the thermally conductive and RF transparent window is configured to permit antenna RF transmission while dissipating heat generated by the active antenna system; and
    an aerogel layer to inhibit the transfer of heat away from the thermally conductive and RF transparent window to a portion of the chassis.

2. The information handling system of claim 1 further comprising:
    a thermally conductive and RF transparent thermal pad placed between the active antenna system and the thermally conductive and RF transparent window.

3. The information handling system of claim 1, wherein the chassis is made of a metal to dissipate heat from the thermally conductive and RF transparent window across a surface area of the chassis.

4. The information handling system of claim 1 further comprising:
    the aerogel layer to inhibit the transfer of heat away from the thermally conductive and RF transparent window towards a c-cover of the chassis of the information handling system.

5. The information handling system of claim 1, wherein the thermally conductive and RF transparent window is made of a liquid-crystal, metal-dioxide, polymer-based plastic.

6. The information handling system of claim 1 further comprising:
    the aperture is formed in a sidewall of the chassis into which the thermally conductive and RF transparent window is injection molded.

7. The information handling system of claim 1 further comprising:
    a tuning module to tune the active antenna system to transceive data through the thermally conductive and RF transparent window and the thermally conductive and RF transparent thermal pad.

8. The information handling system of claim 1 further comprising:
    the aerogel layer above the active antenna system and the thermally conductive and RF transparent window to inhibit the transfer of heat into a c-cover of the chassis while the thermally conductive and RF transparent window directs heat into a metal d-cover of the chassis.

9. An antenna cooling system of an information handling system, comprising:
    an active antenna system with an antenna housed within a metal chassis of the information handling system, the active antenna system operatively coupled to a radio module of a wireless interface device and a power management unit (PMU); and
    a thermally conductive and radio frequency (RF) transparent window molded into in an aperture in the metal chassis of the information handling system where the thermally conductive and RF transparent window is configured to permit RF transmission from the antenna while dissipating heat from the antenna externally from the information handling system; and an aerogel layer to inhibit the transfer of heat away from the thermally conductive and RF transparent window to a portion of the metal chassis.

10. The antenna cooling system of claim 9 further comprising:

a thermally conductive and RF transparent thermal pad placed between the active antenna system and the thermally conductive and RF transparent window.

11. The antenna cooling system of claim 9, further comprising:

the aerogel layer to inhibit the transfer of heat away from the thermally conductive and RF transparent window towards a c-cover of the metal chassis.

12. The antenna cooling system of claim 9, wherein the thermally conductive and RF transparent window is made of a liquid-crystal, metal-dioxide, polymer-based plastic.

13. The antenna cooling system of claim 9 further comprising:

the aperture formed in a sidewall of the metal chassis into which the thermally conductive and RF transparent window is placed.

14. The antenna cooling system of claim 9 further comprising:

a tuning module to tune the active antenna system to transceive data through the thermally conductive and RF transparent window and a thermally conductive and RF transparent thermal pad.

15. The antenna cooling system of claim 9 further comprising:

the aerogel layer along one side of the active antenna system to inhibit the transfer of heat into a c-cover of the metal chassis while the thermally conductive and RF transparent window directs heat into a metal d-cover of the metal chassis.

16. A method of manufacturing an antenna module cooling system for an information handling system, comprising:

forming an antenna window aperture in a wall of a metal chassis of an information handling system;

operatively coupling a thermally conductive and radio frequency (RF) transparent window to the antenna window aperture, where the thermally conductive and RF transparent window is configured to permit antenna RF transmission while dissipating heat generated by an active antenna system and where the thermally conductive and RF transparent window is made of a liquid-crystal, metal-dioxide, polymer-based plastic;

operatively coupling a thermally conductive and RF transparent thermal pad to a side of the thermally conductive and RF transparent window interior to the metal chassis of the information handling system;

operatively coupling the active antenna system with an antenna to the thermally conductive and RF transparent thermal pad;

operatively coupling the active antenna system to a radio module of a wireless interface adapter; and operatively coupling the active antenna system to a power management unit (PMU) for the information handling system.

17. The information handling system of claim 16 further comprising:

operatively coupling a tuning module with the active antenna system, the tuning module to tune the antenna to transceive data through the thermally conductive and RF transparent window and the thermally conductive and RF transparent thermal pad.

18. The information handling system of claim 16, wherein the thermally conductive and RF transparent window dissipates heat from the antenna to the metal chassis and across a surface area of the metal chassis for cooling.

19. The information handling system of claim 16 further comprising:

an aerogel layer to inhibit the transfer of heat away from the thermally conductive and RF transparent window and internal to the information handling system.

20. The information handling system of claim 19, wherein the aerogel layer inhibits the transfer of heat away from the thermally conductive and RF transparent window towards a c-cover of the metal chassis.

* * * * *